United States Patent
Takeuchi et al.

(10) Patent No.: US 8,512,856 B2
(45) Date of Patent: Aug. 20, 2013

(54) METHOD FOR PRODUCING WIRING BOARD AND WIRING BOARD

(75) Inventors: Koji Takeuchi, Tokyo (JP); Masami Matsuda, Saitama (JP); Kaoru Ono, Nagano (JP); Makoto Hosoda, Nagano (JP)

(73) Assignee: Ain Co., Ltd. (JP)

(*) Notice: Subject to any disclaimer, the term of this patent is extended or adjusted under 35 U.S.C. 154(b) by 0 days.

(21) Appl. No.: 12/672,599

(22) PCT Filed: Aug. 7, 2008
(Under 37 CFR 1.47)

(86) PCT No.: PCT/JP2008/064185
§ 371 (c)(1),
(2), (4) Date: Dec. 27, 2010

(87) PCT Pub. No.: WO2009/020169
PCT Pub. Date: Feb. 12, 2009

(65) Prior Publication Data
US 2011/0290543 A1 Dec. 1, 2011

(30) Foreign Application Priority Data
Aug. 8, 2007 (JP) ................. 2007-206943

(51) Int. Cl.
*B32B 5/16* (2006.01)
*B32B 9/04* (2006.01)
*B32B 9/06* (2006.01)

(52) U.S. Cl.
USPC ........ 428/320.2; 428/323; 428/325; 428/327; 428/447; 428/450; 428/209; 174/258

(58) Field of Classification Search
USPC ................. 428/209, 320.1, 320.2, 323, 325, 428/327, 447, 450; 174/250–258, 138 C
See application file for complete search history.

(56) References Cited

U.S. PATENT DOCUMENTS

| | | | | |
|---|---|---|---|---|
| 4,639,285 A | * | 1/1987 | Suzuki et al. | 156/272.6 |
| 4,670,351 A | * | 6/1987 | Keane et al. | 428/549 |
| 4,910,077 A | * | 3/1990 | Benedikt | 442/232 |
| 5,450,286 A | * | 9/1995 | Jacques et al. | 361/749 |
| 5,622,782 A | * | 4/1997 | Poutasse et al. | 428/344 |

(Continued)

FOREIGN PATENT DOCUMENTS

| CN | 1325565 C | 7/2007 |
|---|---|---|
| JP | 63-96990 A | 4/1988 |

(Continued)

OTHER PUBLICATIONS

International Search Report for International Application No. PCT/JP2008/064185 mailed Nov. 4, 2008 with English Translation.

(Continued)

*Primary Examiner* — Cathy Lam
(74) *Attorney, Agent, or Firm* — Cantor Colburn LLP

(57) ABSTRACT

The present invention provides a wiring board giving good heat dissipation over a long period of use. The present invention also provides a method for producing a wiring board, including coating a surface of a metal substrate, which is made of an aluminum plate, with a composition containing a substance having a polysiloxane structure and inorganic particles having insulating and heat-dissipating properties, curing the composition, then bonding a copper foil to the cured composition, and partially removing the copper foil, thereby forming a wiring layer.

4 Claims, 2 Drawing Sheets

(56) References Cited

U.S. PATENT DOCUMENTS

| | | | |
|---|---|---|---|
| 5,879,794 A * | 3/1999 | Korleski, Jr. | 428/317.1 |
| 6,054,651 A * | 4/2000 | Fogel et al. | 174/110 F |
| 6,372,337 B2 * | 4/2002 | Takahashi et al. | 428/328 |
| 6,572,968 B2 * | 6/2003 | Takano et al. | 428/391 |
| 7,001,662 B2 * | 2/2006 | Sugaya et al. | 428/344 |
| 7,166,361 B2 | 1/2007 | Baba et al. | |
| 8,092,900 B2 * | 1/2012 | Shimoosako et al. | 428/209 |
| 2007/0292709 A1 | 12/2007 | Oishi et al. | |

FOREIGN PATENT DOCUMENTS

| | | |
|---|---|---|
| JP | 6-104542 A | 4/1994 |
| JP | 2002-329939 A | 11/2002 |
| JP | 2005-60501 A | 3/2005 |
| JP | 2005-251562 A | 9/2005 |
| JP | 2005-281509 A | 10/2005 |
| JP | 2005-290184 A | 10/2005 |
| JP | 2006-110999 A | 4/2006 |
| WO | 2006/022207 A1 | 3/2006 |

OTHER PUBLICATIONS

Office Action for Chinese Application No. 200880106721.3, mailed Nov. 30, 2011, with partial English translation.

Office Action for Japanese Application No. 2012-099355, mailed Jun. 4, 2012, with English translation.

* cited by examiner

METHOD FOR PRODUCING WIRING BOARD AND WIRING BOARD

CROSS REFERENCE TO RELATED APPLICATIONS

This is a U.S. national stage application of International Application No. PCT/JP2008/064185, filed on 7 Aug. 2008. Priority under 35 U.S.C. §119 (a) and 35 U.S.C. §365(b) is claimed from Japanese Application No. JP2007-206943, filed 8 Aug. 2007, the disclosure of which is also incorporated herein by reference.

TECHNICAL FIELD

The present invention relates to a method for producing a wiring board and a wiring board.

BACKGROUND ART

In order to increase the packing density of high heat generating components such as light emitting diodes, the wiring boards on which these components are mounted are required to achieve high heat dissipation. In order to obtain a wiring board having good heat dissipation properties, Patent Document 1 proposes a method for producing a wiring board, the method including applying an insulating water-soluble clay to a metal sheet as the substrate, thereby forming a heat-dissipating ceramic layer.

Patent document 1: Japanese Patent Application Laid-Open No. 2002-329939

DISCLOSURE OF INVENTION

Problems to be Solved by the Invention

However, it was found that the heat-dissipating ceramic layer obtained by applying a water-soluble clay as described in Patent Document 1 readily falls off from the metal sheet as the substrate due to its high hygroscopicity. Accordingly, the wiring board obtained using the method described in Patent Document 1 will not endure long-term use.

In view of the above-described problem, the present invention is intended to provide a wiring board giving good heat dissipation over a long period of use.

Means for Solving the Problem

In order to achieve this, the method for producing a wiring board according to the present invention includes coating a surface of a metal substrate with a composition containing a substance having a polysiloxane structure and inorganic particles having insulating and heat-dissipating properties, and curing the composition. The substance having a polysiloxane structure includes a substance having a siloxane oligomer structure (hereinafter the same). The term "insulating properties" refers to the nature of a substance which allows conduction along wiring on the wiring board, even if the substance is in contact with the wiring parts of the wiring board. The term "heat-dissipating properties" refers to the nature of a substance which absorbs heat from the wiring parts of a wiring board with which the substance is in contact, and releases the heat to other parts or the atmosphere.

In the method for producing a wiring board according to an aspect of the present invention, the inorganic particles in the coating substance have insulating and heat-dissipating properties. The substance having a polysiloxane structure and its cured product have insulating properties, and will not readily fall off from the metal substrate. Accordingly, when a wiring layer is formed on the surface of the metal substrate with a cured layer of the above-described composition sandwiched therebetween, the resultant wiring board gives good dissipation over a long period of use.

In the method for producing a wiring board according to another aspect of the present invention, the above-described method further includes a step of bonding a metal foil or sheet to the composition before the curing step, and partially removing the metal foil or sheet to form a wiring layer after the curing step. The method provides a wiring layer wherein a metal foil or sheet is sufficiently adhered to a cured composition.

In the method for producing a wiring board according to yet another aspect of the present invention, the inorganic particles used in the above-described method include at least one selected from the group consisting of silicon oxide, aluminium oxide, zinc oxide, aluminium nitride, and boron nitride. The method uses inorganic particles having particularly good thermal conductivity, and thus provides a wiring board giving good heat dissipation.

In the method for producing a wiring board according to yet another aspect of the present invention, the metal substrate used in the above-described method contains micropores in its surface. The method brings out the anchoring effect of the micropores, whereby the metal substrate is sufficiently adhered to the cured composition, and the surface area of the metal substrate is increased, thus giving better heat dissipation.

In the method for producing a wiring board according to yet another aspect of the present invention, the metal substrate used in the above-described method is made by weaving metal yarn. The method brings out the anchoring effect of the weave texture, whereby the metal substrate is sufficiently adhered to the cured composition, and the surface area of the metal substrate is increased, thus giving better heat dissipation.

In order to solve the above-described problem, the wiring board according to the present invention includes, as an insulating member, a cured composition containing a cured substance having a polysiloxane structure and inorganic particles having insulating and heat-dissipating properties.

In the wiring board according to an aspect of the present invention, the inorganic particles in the insulating member have heat-dissipating and insulating properties. The cured substance having a polysiloxane structure has insulating properties, and will not readily fall off from a metal substrate or the like. Accordingly, when the insulating member is arranged on the surface of the metal substrate, and a wiring layer is formed on the insulating member, the resultant wiring board achieves good heat dissipation over a long period of use. The cured composition can be used as a solder resist. In this case, the wiring board is stable over a long period of use under harsh conditions.

In the wiring board according to another aspect of the present invention, the composition included in the above-described wiring board contains 60 to 80 parts by mass of inorganic particles. According to this composition, the content ratio of the inorganic particles enough for achieving good adhesion with the metal substrate and achieving good heat dissipation.

In the wiring board according to yet another aspect of the present invention, the inorganic particles included in the above-described wiring board contains at least one selected from the group consisting of silicon oxide, aluminium oxide, zinc oxide, aluminium nitride, and boron nitride. The wiring board includes inorganic particles having particularly good thermal conductivity, and thus achieves good heat dissipation.

In the wiring board according to yet another aspect of the present invention, the cured composition included in the above-described wiring board has a Hunter whiteness (below-described) of 87 or more. The wiring board is resistant to deterioration caused by ultraviolet irradiation, because the cured composition coating the wiring board reflects the ultraviolet ray applied thereto.

Effect of the Invention

The present invention provides a wiring board which achieves good heat dissipation over a long period of use.

Figure 1A:
FIG. 1 shows the procedure for producing a wiring board according to an embodiment of the present invention, with reference to the longitudinal sectional views of the wiring board and its precursors. The production flow of the wiring board proceeds from step (A) through step (D).

REFERENCE NUMERALS 1 wiring board
2 metal substrate
3 composition
3A cured composition
4 copper foil (metal foil)
5 wiring layer

BEST MODE FOR CARRYING OUT THE INVENTION

The method for producing a wiring board 1 according to an embodiment of the present invention is described below with reference to drawings.

Figure 1B:
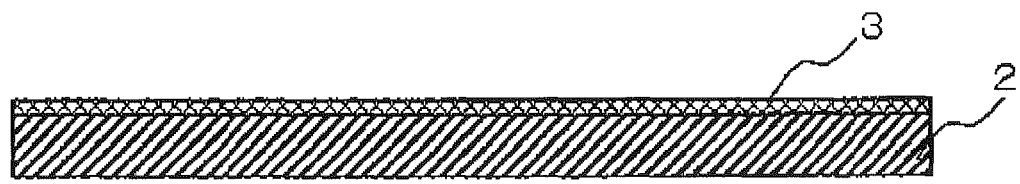
Figure 1C:
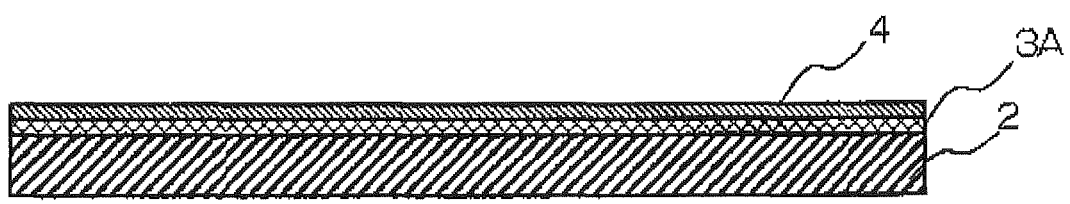
Figure 1D:
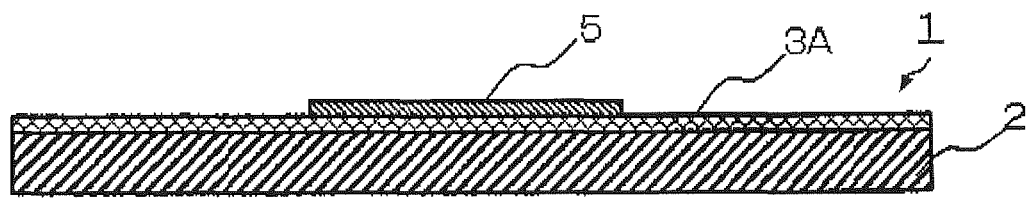

The method for producing the wiring board 1 according to an embodiment of the present invention includes coating a surface of a metal substrate 2, which is made of an aluminium plate, with a composition 3 containing a substance having a polysiloxane structure and inorganic particles having insulating and heat-dissipating properties as shown FIG. 1 (FIG. 1(B)), then curing the composition 3, bonding a copper foil 4 to the composition 3 (FIG. 1(C)), and partially removing the copper foil 4, thus forming a wiring layer 5 (FIG. 1(D)). The term "insulating properties" refers to the nature of a substance which allows conduction along wiring on the wiring board, even if the substance is in contact with the wiring parts of the wiring board. The term "heat-dissipating properties" refers to the nature of a substance which absorbs heat from the wiring parts of a wiring board with which the substance is in contact, and releases the heat to other parts or the atmosphere.

The composition 3 is prepared as follows. Firstly, 20 parts by mass of tetramethoxysilane ($Si(OCH_3)_4$) and 80 parts by mass of methyltrimethoxysilane ($CH_3Si(OCH_3)_3$) are mixed with 100 parts by mass of ethyl alcohol, and the mixture is allowed to react catalyzed by hydrochloric acid, thus obtaining an acidic solution. Secondly, the acidic solution is neutralized with diethylamine ($CH_3CH_2NHCH_2CH_3$), thus obtaining a neutral solution. The solvent of the neutral solution is replaced with diethylene glycol butyl ether, thus obtaining a resin solution having a resin nonvolatile content of 60% and a viscosity of 400 cp. The resin solution is mixed with silicon oxide particles having an average particle size of 2.3 μm (manufactured by Denki Kagaku Kogyo Kabushiki Kaisha, trade name: FS-3DC) and titanium oxide powder (manufactured by Furukawa Chemicals Co., Ltd., trade name: FR-22), and the mixture is kneaded with a triple roll mill, thus obtaining a paste. The paste is used as the composition 3. The composition 3 is composed of a substance having a polysiloxane structure and inorganic particles. The composition 3 contains silicon oxide particles and titanium oxide particles having insulating and heat-dissipating properties. The silicon oxide particles account for 40 parts by mass of the composition 3. The titanium oxide particles account for 30 parts by mass of the composition 3. Therefore, the composition 3 contains 70 parts by mass of inorganic particles.

In order to coat a surface of the metal substrate 2 with the composition 3 (FIG. 1(B)), the paste of the composition 3 is attached to the surface of the metal substrate 2 by screen printing using a 250 mesh printing plate made of stainless steel.

The attached composition 3 is dried at 80° C. for 30 minutes. The composition 3 is not hard at this point. Thereafter, the copper foil 4 is affixed to the surface of the composition 3, and heated at 200° C. for 60 minutes in a heating furnace, thereby curing the composition 3 to obtain the cured composition 3A. At that time, the copper foil 4 is pressed against the cured composition 3A, whereby the copper foil 4 is bonded to the cured composition 3A (FIG. 1(C)). The cured composition 3A has a Hunter whiteness of 90 to 92. The cured state refers to a state where the composition is insoluble in a solvent in which the uncured composition is soluble. In other words, the composition 3 in a cured state resembles $SiO_2$ as a result of condensation by dehydration or dealcoholization.

Thereafter, the copper foil 4 is partially removed. More specifically, the wiring layer 5 is formed from the copper foil 4 by so-called subtraction method. In order to form the wiring layer 5, firstly, a resist having a shape corresponding to the wiring pattern is arranged on the surface of the copper foil 4, and the copper foil 4 is etched. Subsequently, the resist is removed, and the remaining portion of the copper foil 4 forms the wiring pattern shape, thus forming the wiring layer 5 as shown in FIG. 1(D). In this manner, the wiring board 1 according to an embodiment of the present invention is produced.

The wiring board 1 according to an embodiment of the present invention thus produced includes, as an insulating member, the cured composition 3A containing a substance having a polysiloxane structure and silicon oxide particles and titanium oxide particles as inorganic particles.

In the wiring board 1 according to an embodiment of the present invention, the cured composition 3A has insulating properties, and will not readily fall off from the metal substrate 2. Therefore, when the wiring layer 5 is formed on the surface of the metal substrate 2 with a layer of the cured composition 3A sandwiched therebetween, the wiring layer 5 will not fall off over a long term. As a result of this, the wiring board 1 achieves good heat dissipation over a long period of use.

The above-described resin solution is cured to become a substance having an amorphous glass structure. The substance has a siloxane bond (Si—O). The siloxane bond is stable and far stronger than other bonds such as C—C or C=O forming many organic compounds. Organopolysiloxane (commonly referred to as silicone) having a siloxane backbone and an organic group in the side chain thereof is superior in heat resistance, cold resistance, weather resistance, electrical properties, water repellency, and releasability.

Other Embodiments and Effects Thereof

The above-described method for producing the wiring board 1 and the wiring board 1 thus produced are preferred embodiments of the present invention. However, the present invention will not limited to them, and allows various modifications without departing from the spirit of the present invention.

In the above-described embodiment, the metal substrate 2 is made of an aluminum plate. The aluminum plate may be replaced with other metal such as a stainless steel plate or an aluminium alloy plate. The metal substrate may contain micropores in its surface. The metal substrate brings out the anchoring effect of the micropores, whereby the adhesion between the metal substrate and the cured composition 3A is improved, and the surface area of the metal substrate is increased, thus giving better heat dissipation. The metal substrate may be made by weaving metal yarn. The metal substrate brings out the anchoring effect of the weave texture, whereby the adhesion between the metal substrate and the cured composition 3A is improved, and the surface area of the metal substrate is increased, thus giving better heat dissipation.

In the above-described embodiment, the substance having a polysiloxane structure, which composes the composition 3, is derived from 20 parts by mass of tetramethoxysilane (Si(OCH$_3$)$_4$ and 80 parts by mass of methyltrimethoxysilane (CH$_3$Si(OCH$_3$)$_3$). Alternatively, the substance having a polysiloxane structure may be derived from one or more alkoxysilane compounds, chlorosilane, or the like.

The cured product of the substance having a polysiloxane structure normally has an amorphous glass structure composed mainly of silicic acid. Therefore, when the cured product of the substance having a polysiloxane structure is different from ordinary resins in that it has ceramic-like properties; it has poor hygroscopicity, scarcely changes over time in electrical and thermal properties, and its original properties are hardly changed by various gases and organic solvents. Accordingly, when the cured product of the substance having a polysiloxane structure is used as an insulating member of a wiring board, the wiring board can ensure sufficient electrical and thermal stability required for the wiring board. For example, when the cured product of the substance having a polysiloxane structure is used as an inside insulating layer of a wiring board, the internal resistance value is hardly changed by moisture absorption. The cured product of the substance having a polysiloxane structure is heat resistant (will not denatured) up to 500 to 600° C. The cured product of the substance having a polysiloxane structure conforms to thermal expansion and thermal shrinkage of metal substrate materials such as copper and iron, and other materials such as quartz and zirconia, so that hardly causes cracks due to temperature change. In particular, the cured composition 3A composed of the cured product of the substance having a polysiloxane structure and 40% or more inorganic particles is readily conforms to thermal expansion and thermal shrinkage. In addition, the cured product of the substance having a polysiloxane structure has hardness equivalent to glass, so that it is hardly damaged by shocks such as scratching.

The above-described alkoxysilane is generally represented by the following formula.

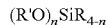

(R'O)$_n$SiR$_{4-n}$

R: CH$_3$, C$_2$H$_5$, C$_3$H$_7$, C$_4$H$_9$, C$_6$H$_5$
R': CH$_3$, C$_2$H$_5$, C$_3$H$_7$, C$_4$H$_9$
n: 1 to 4

For example, trimethoxymethylsilane (a kind of alkoxysilane) having three alkoxy groups is hydrolyzed to generate silanol groups, and repeats condensation to change into an oligomer and a polymer having network structures. Through the use of alkoxysilanes having different n values, the resultant polysiloxanes have different structures ranging from a chain-like structure to a network structure. The curing may be accelerated by heating or the addition of an appropriate catalyst (for example, an acid, a metallic soap such as Zn, Pb, Co, or Sn, an amine, or dibutyltin laurate).

Organopolysiloxane is synthesized from chlorosilane or alkoxysilane. Organopolysiloxane synthesized from chlorosilane has (—OH) at the terminals. Alternatively, organopolysiloxane synthesized from alkoxysilane has (—OH) and (—OR) at the terminals.

Examples of the structure of alkoxysilane are represented by chemical formula 1 and 2. One or more reaction products of the substances having these structures may be used as the substances having a polysiloxane structure.

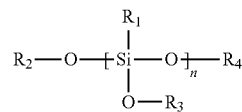

[Chemical Formula 1]

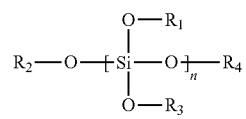

[Chemical Formula 2]

R$_1$, R$_2$, R$_3$, R$_4$ : H, CH$_3$, C$_2$H$_5$, C$_3$H$_7$, C$_4$H$_5$, C$_6$H$_5$

The structure of the cured product of the substance having a polysiloxane is similar to that of silicic acid. Silicic acid causes molecular vibration to emit far-infrared rays upon application of vibration or thermal energy. Owing to the properties, heat energy accumulated in silicic acid is decreased by the emission of a far-infrared rays, which are electromagnetic waves. As a result of this, the heat generated by the electronic component mounted on a wiring board can be efficiently dissipated.

In the above-described embodiment, the inorganic particles contained in the composition 3 in the proportion of 70 parts by mass are composed of 40 parts by mass of silicon oxide particles having an average particle size of 2.3 μm and 30 parts by mass of titanium oxide particles. The silicon oxide particles may be replaced with any other substance. The inorganic particles may be, for example, at least one selected from the group consisting of aluminium oxide particles, zinc oxide particles, and aluminium nitride particles. Alternatively, the inorganic particles may be at least two or more selected from the group consisting of aluminium oxide particles, zinc oxide particles, aluminium nitride particles, and boron nitride particles. The parts by mass of the inorganic particles contained in the composition 3 is not particularly limited. However, in order to secure the quantitative proportion of the composition 3 enough for sufficient adhesion to the metal substrate 2, and to achieve sufficient heat dissipation, the parts by mass of the inorganic particles is preferably from 60 to 80 parts by mass. The composition 3 is particularly preferably composed of 20 to 40 parts by mass of a nonvolatile component of a 60% reaction resin solution, 30 to 50 parts by mass of silicon oxide particles, and 10 to 40 parts by mass of titanium oxide particles. The average particle size of the inorganic particles is not particularly limited.

In the above-described embodiment, the wiring layer 5 is made of the copper foil 4. Alternatively, the wiring layer 5 may be made of a copper plate, or a metal foil or sheet other than copper. The copper foil 4 may be replaced with a copper electroless plating layer. A copper electroless plating layer is advantageous in that it readily forms a compact and complex wiring pattern by the above-described subtraction method.

In the above-described embodiment, the copper foil 4 is pressed against the surface of the composition 3 before curing the composition 3. However, any adhesion method other than the pressing may be used. For example, the copper foil 4 may be attached to the cured composition 3A after curing the composition 3.

In the above-described embodiment, the wiring layer 5 is formed by the subtraction method. Alternatively, an additive method may be used, such as plating with a wiring pattern, printing with a conductive paste, metal deposition on the areas corresponding to the wiring pattern, or adhesion to a substrate having a wiring pattern formed in advance.

In the above-described embodiment, the cured composition 3A is used as a member for covering the metal substrate 2. Alternatively, the cured composition 3A may be used as a solder resist for partially coating the wiring layer 5. The solder resist is placed outermost of the wiring board, and thus readily achieves the stability of the cured composition 3A under severe use conditions such as a high humidity or exposure to various gases.

In the above-described embodiment, the cured composition 3A has a Hunter whiteness of 90 to 92. The Hunter whiteness of the cured composition 3A may be decreased to 86 or less by changing the color of the composition 3 by adding pigment and so on. When LEDs are mounted on the wiring board, the Hunter whiteness of the cured composition 3A is preferably 87 or more thereby reflecting ultraviolet rays emitted from the LEDs. In particular, when the cured composition 3A is used as a solder resist of a wiring board composed mainly of a resin, deterioration of the resin by ultraviolet irradiation is prevented by the cured composition 3A having high whiteness. As with the above-described embodiment, when the cured composition 3A is arranged on the entire surface of the wiring board 1, and LEDs are mounted on the wiring board 1, the wiring board 1 may serve as a light reflector for concentrating light irradiation direction. In order to further improve the light reflectance of the cured composition 3A, the cured composition 3A may contain glass beads. The content of the glass beads is preferably from 5 to 10 parts by mass with reference to the cured composition 3A. In order to achieve a Hunter whiteness of 87 or more, the inorganic particles are preferably titanium oxide particles.

Examples

In the composition 3, the mixing ratio (mass ratio) between the inorganic particles composed of silicon oxide particles and titanium oxide particles and the substance having a polysiloxane structure was changed as shown in Table 1, and the state of the film of the cured composition 3A was evaluated. The mixing ratio between the silicon oxide particles and titanium oxide particles composing the inorganic particles was constant. The state of the film was evaluated based on the pencil hardness measured in accordance with JIS K 5600-5-4. In Table 1, "A" represents a pencil hardness of 6H or higher, "B" represents a pencil hardness of H or higher and 5H or less, and "C" represents a pencil hardness of HB. The results indicate that the cured composition 3A achieved a high pencil hardness for all the mixing ratios, and achieved a particularly favorable hardness when the composition 3 contains 60 to 80 parts by mass of inorganic particles.

TABLE 1

|  | Inorganic Particles/Siloxane Compound (mass ratio) | | | | | |
| --- | --- | --- | --- | --- | --- | --- |
|  | 40/60 | 50/50 | 60/40 | 70/30 | 80/20 | 90/20 |
| After heating at 200° C. for 60 minutes | B | B | A | A | A | B |
| After heating at 250° C. for 60 minutes | C | B | A | A | A | B |
| After heating at 300° C. for 60 minutes | C | C | A | A | B | C |

Table 2 shows the viscosity of the paste of the composition 3, the heating residue after curing, and the color hue of the cured composition 3A. The viscosity was measured using a B type rotational viscometer (model name: TV-10, manufactured by Toki Sangyo Co., Ltd.) under conditions that the rotor was No. 23 (M4), the liquid temperature was 24.8° C., the solution amount was 183 g (150 ml), and the test vessel was a 150 g disposable cup.

TABLE 2

| Tested for | Result | Conditions |
| --- | --- | --- |
| Viscosity | 80000-150000 mPas | 25 ± 0.5° C. B type rotational viscometer |
| Heating residue | 83-87% | 140 ± 5° C. 4 hr |
| Color tone | White | Determined by color sample |

Table 3 shows the test results of the printability of the composition 3 and various properties of the cured composition 3A respectively. The printing conditions were as follows: the paste of the composition 3 was printed in the form of a 30 mm square on a glass plate using a stainless steel 250-mesh screen. The curing conditions after printing were as follows: the composition 3 was dried at 80° C. for 30 minutes to form a film having a thickness of, for example, 23 μm, followed by heating for 60 minutes in a hot heating furnace. The cured composition 3A subjected to voltage tolerance test had a thickness of 20 μm, 30 μm, or 70 μm after printing.

TABLE 3

| Tested for | Conditions | Result |
| --- | --- | --- |
| Printability (when printed) | Printed using a 250-mesh stainless steel screen, and visually observed (in accordance with JIS B 9620-1). | No repellence or foaming. |
| Adhesion | Adhesive tape peeling test in accordance with JIS K 5600-5-6 (performed on a copper plate, a glass epoxy substrate, and a glass plate) | No peeling |

TABLE 3-continued

| Tested for | Conditions | Result |
|---|---|---|
| Pencil hardness | Pencil hardness test in accordance with JIS K 5600-5-4 (tested on a glass plate) | No peeling with a 6H pencil |
| Heat resistance | Three times of reflowing at 260° C. for 10 seconds. | No disorders such as swelling or peeling. |
| Color fading by heating | heat treatment at 200° C. for 24 hours (performed on a glass plate). | No fading of white color. |
| Acid resistance | Immersed in 2% sulfuric acid at 20° C. for 10 minutes. | No disorders such as swelling or peeling. |
| Alkali resistance | Immersed in a 2% caustic soda at 20° C. for 10 minutes. | No disorders such as swelling or peeling. |
| Warm water resistance | Immersed in warm water at 60 to 70° C. for 2 hours. | No disorders such as swelling or peeling. |
| Solvent resistance | Immersed in methyl ethyl ketone at room temperature for 2 hours. | No disorders such as swelling or peeling. |
| Insulation resistance | 10 μm film, 1000 V/1 second | $1 \times 10^9$ Ω or more |
| Voltage tolerance | 1. μm thickness 20 μm<br>2. μm thickness 30 μm<br>3. μm thickness 70 μm | 1. 1100 V or more<br>2. 2800 V or more<br>3. 5000 V or more |
| Heat dissipation | The cured composition 3A and a control were heated side by side and tested. | Better heat dissipation than control |

In Table 3, the control used for "the heat dissipation" test was prepared by curing PSR4000 manufactured by Taiyo Ink Mfg. Co., Ltd. (a print of 30 mm square and a thickness of 23 μm) in place of the composition 3.

The results in Table 3 indicate that the composition 3 achieved good printability, and that the print of the cured composition 3A gave good adhesion to the substrate. Also indicated are that the cured composition 3A after printing was superior in hardness, heat resistance, acid and alkali resistance, warm water resistance, solvent resistance, insulation resistance, voltage tolerance, and heat dissipation.

Other cured compositions 3B to 3F, which work in the same manner as the cured composition 3A, were prepared. The cured compositions 3B to 3F were prepared as follows. Firstly, 20 parts by mass of tetraethoxysilane ($Si(C_2H_5O)_4$) and 80 parts by mass of phenyltriethoxysilane ($C_6H_5Si(OC_2H_5)$) were mixed with 100 parts by mass of ethyl alcohol, and the mixture was reacted with formic acid as a catalyst to obtain acidic solution. Secondly, the acidic solution was neutralized with triethylamine (($C_2H_5)_3N$) to obtain a neutral solution. The solvent of the neutral solution was replaced with diethylene glycol butyl ether acetate to obtain a resin solution containing 60% nonvolatile resin and having a viscosity of 400 cp. The resin solution was mixed with at least one powder selected from the group consisting of titanium oxide particles, silicon oxide particles (manufactured by Denki Kagaku Kogyo Kabushiki Kaisha, trade name: FS-3DC), aluminum oxide particles (manufactured by Denki Kagaku Kogyo Kabushiki Kaisha, trade name: DAM-05), zinc oxide particles, aluminium nitride particles, and boron nitride particles, and the mixture was kneaded with a triple roll mill, thereby obtaining the five pastes 3B to 3F shown in Table 4. These pastes were cured to obtain the cured compositions 3B to 3F. The symbols (3B to 3F) given to the cured compositions 3B to 3F correspond to the symbols (3B to 3F) given to the pastes shown in Table 4. For example, the paste 3B is cured to give the cured composition 3B. These cured compositions 3B to 3F contain a cured product of a substance having a polysiloxane structure, and inorganic particles having insulating and heat-dissipating properties.

TABLE 4

| | Paste | | | | |
|---|---|---|---|---|---|
| | 3B | 3C | 3D | 3E | 3F |
| Reacted resin solution (part by mass) | 50 | 50 | 50 | 50 | 50 |
| Titanium oxide particles (part by mass) | 20 | 20 | 20 | 20 | 20 |
| Silicon dioxide particles (part by mass) | 50 | 30 | 30 | 30 | 30 |
| Aluminum oxide particles (part by mass) | 0 | 20 | 0 | 0 | 0 |
| Zinc oxide particles (part by mass) | 0 | 0 | 20 | 0 | 0 |
| Aluminum nitride particles (part by mass) | 0 | 0 | 0 | 20 | 0 |
| Boron nitride particles (part by mass) | 0 | 0 | 0 | 0 | 20 |

The prints of the pastes 3B to 3F shown in Table 4 and the control paste used for the heat dissipation test shown in Table 3 were individually mounted on a hot plate at 200° C., and the surface temperature after a lapse of a specified time was measured; the results are shown in Table 5. Before a lapse of 2 minutes after heating, or before the first measurement, the pastes hardened to give the cured compositions 3B to 3F and the control.

TABLE 5

| | Control | 3B | 3C | 3D | 3E | 3F |
|---|---|---|---|---|---|---|
| 2 minutes after | 150° C. | 140° C. | 140° C. | 135° C. | 130° C. | 130° C. |
| 4 minutes after | 180° C. | 170° C. | 160° C. | 160° C. | 155° C. | 155° C. |
| 6 minutes after | 190° C. | 175° C. | 170° C. | 170° C. | 165° C. | 165° C. |
| 10 minutes after | 190° C. | 175° C. | 170° C. | 170° C. | 165° C. | 165° C. |

The results shown in Table 5 indicate that the rises in the surface temperature of the cured compositions 3B to 3F were smaller than that of the control. The suppression of the surface temperature rise implies that the cured compositions 3B to 3F provide high heat dissipation. The cured compositions 3E and 3F containing aluminium nitride or boron nitride particles as the inorganic particles achieved particularly high heat dissipation.

Thereafter, the cured composition 3A was tested for the insulation resistance and the adhesion to the substrate.

Firstly, the paste of the composition 3 was printed on an aluminum plate having a thickness of 3 mm using a 150-mesh stainless steel screen printing plate. The print was dried at 80° C. for 30 minutes, followed by curing under heating at 200° C. for 40 minutes, thereby forming an insulating layer A having a thickness of 35 µm and composed mainly of inorganic particles on the aluminum plate.

Secondly, on the insulating layer A, the reacted resin solution, which had been obtained during the preparation of the composition 3, was printed using a 325-mesh stainless steel screen printing plate. The print was dried at 80° C. for 30 minutes to form a film of a siloxane compound having a thickness of 10 µm. A copper foil (35 µm) was mounted on the siloxane compound film, and pressed against each other using a vacuum press under pressure in a vacuum at 160° C. for 20 minutes, followed by heating at 200° C. for 40 minutes to bond the aluminum plate, film, and copper foil, thereby obtaining a complex A.

The paste of the composition 3 was printed on a copper foil having a thickness of 50 µm using a 150-mesh stainless steel screen printing plate. The print was dried at 80° C. for 30 minutes to form an insulating layer B having a thickness of 35 µm and composed mainly of inorganic particles. The same paste was further printed on the insulating layer B using a 250-mesh stainless steel screen printing plate. A sheet made of woven stainless steel yarn, which contains micropores so as to correspond a 150-mesh sheet, was pressed against the print under pressure, followed by heating at 180° C. for 60 minutes, thereby obtaining a complex B composed of the sheet, print, and copper foil.

In place of the sheet made of stainless steel yarn used for making the complex B, a porous stainless steel foil containing micropores so as to correspond a 200-mesh sheet, which had been made by etching a stainless steel foil having a thickness of 100 µm, was used. The stainless steel foil was pressed against the above-described print under pressure, followed by heating at 180° C. for 60 minutes, thereby obtaining a complex C composed of a porous stainless steel foil, print, and copper foil.

The copper foils of the complexes A, B, and C were subjected to etching to form copper wiring patterns in the specified forms. Thereafter, the prints and substrates (an aluminum plate, a sheet made of woven stainless steel yarn, and a porous stainless steel foil) of the complexes A, B, and C were subjected to insulation and adhesion tests. The insulation test was carried out in accordance with the surface layer voltage tolerance test specified in JIS C 5012. The adhesion test was carried out in accordance with JIS K 5600-5-7. The test results are shown in Table 6.

TABLE 6

|  | Complex A | Complex B | Complex C |
|---|---|---|---|
| Voltage tolerance | 3 kV | 2.8 kV | 3.1 kV |
| Adhesion | 800 g/cm | 1000 g/cm | 900 g/cm |

The results shown in Table 6 indicate that the complexes A, B, and C achieved good voltage tolerance and adhesion. In particular, the complexes B and C includes a sheet made of woven stainless steel yarn or a porous stainless steel foil as the substrate, so that they achieved good adhesion to the print.

Subsequently, the whiteness and light reflectance of the cured composition 3A were tested.

The whiteness and light reflectance were measured using ND-300A (color-difference meter CN-2) manufactured by Nippon Denshoku Industries Co., Ltd. The whiteness was measured by Hunter system in accordance with JIS K 5981. Under the Hunter system, the whiteness (W) is determined by the following equation (1):

$$W = 100 - [(100-L)^2 + a^2 b^2]^{1/2} \quad (1)$$

wherein W represents whiteness, L represents lightness, a represents a color hue which is more reddish at the + side and more greenish at the − side, and b represents a color hue which is more yellowish at the + side, and more bluish at the − side. The higher the L value, the higher the light reflectance.

The whiteness was measured at five points of each of the cured composition 3A (n=2), and the average was calculated. The control was a cured product of LE-6000F manufactured by SAN-EI Kagaku Co., Ltd. (30 mm square, 23 µm thick), which is used as a solder resist. The measurement results are shown in Table 7.

TABLE 7

| Test sample | Measured point | L | a | b | W |
|---|---|---|---|---|---|
| Control | 1 | 86.47 | −0.67 | 0.94 | 86.42 |
|  |  | 86.79 | −0.69 | 0.99 | 86.74 |
|  | 2 | 86.81 | −0.89 | 0.81 | 86.75 |
|  |  | 86.62 | −0.74 | 1.03 | 86.56 |
|  | 3 | 86.64 | −0.65 | 0.81 | 86.60 |
|  |  | 86.67 | −0.61 | 0.87 | 86.62 |
|  | 4 | 86.63 | −0.58 | 0.91 | 86.59 |
|  |  | 86.31 | −0.48 | 0.75 | 86.28 |
|  | 5 | 86.33 | −0.55 | 0.70 | 86.31 |
|  |  | 86.45 | −0.43 | 0.80 | 86.28 |
|  | Average | 86.57 | −0.63 | 0.86 | 86.53 |
| Cured composition 3A | 1 | 91.86 | −0.61 | 0.97 | 91.78 |
|  |  | 91.56 | −0.75 | 0.89 | 91.48 |
|  | 2 | 91.74 | −0.70 | 0.94 | 91.65 |
|  |  | 91.61 | −0.69 | 0.90 | 91.54 |
|  | 3 | 91.77 | −0.48 | 0.89 | 91.71 |
|  |  | 91.60 | −0.51 | 0.84 | 91.55 |
|  | 4 | 91.79 | −0.58 | 0.93 | 91.72 |
|  |  | 91.45 | −0.54 | 0.86 | 91.39 |
|  | 5 | 92.08 | −0.56 | 0.95 | 92.00 |
|  |  | 91.89 | −0.52 | 0.96 | 91.82 |
|  | Average | 91.74 | −0.59 | 0.91 | 91.66 |

The results shown in Table 7 indicate that the cured composition 3A achieved higher whiteness and light reflectance than the control.

After measuring the whiteness and light reflectance shown in Table 7, the cured composition 3A and the control used for the measurements were heated at 200° C. for 24 hours. After cooling, the same measurements were carried out, and the degree of color fading was evaluated. The results are shown in Table 8.

TABLE 8

| Test sample | — | L | a | b | W | Reduction in L (%) | Reduction in W (%) |
|---|---|---|---|---|---|---|---|
| Control | Average before heating | 86.57 | −0.63 | 0.86 | 86.53 | 2.1 | 4.4 |
|  | Average after heating | 84.69 | −1.2 | 7.88 | 82.74 |  |  |

TABLE 8-continued

| Test sample | — | L | a | b | W | Reduction in L (%) | Reduction in W (%) |
|---|---|---|---|---|---|---|---|
| Cured composition 3A | Average before heating | 91.74 | −0.59 | 0.91 | 91.66 | 1.6 | 1.7 |
| | Average after heating | 90.31 | −0.4 | 1.78 | 90.14 | | |

The results shown in Table 8 indicate that all the samples deteriorated in whiteness and light reflectance, but the reduction was smaller in the cured composition 3A than the control. In other words, the cured composition 3A achieved higher heat resistance than the control.

The invention claimed is:

1. A wiring board comprising:
a metal substrate;
a layer made of an insulating member;
and a metal layer selected from the group consisting of a metal foil, a metal sheet, and a plating layer;
wherein the metal substrate, the layer made of the insulating member, and the metal layer are laminated in the stated order;
wherein only the layer made of the insulating member is provided between the metal substrate and the metal layer;
wherein the insulating member comprises a composition prepared by curing a mixture comprising:
(a) a cured product of a substance having a polysiloxane structure derived from at least one of alkoxysilane and chlorosilane, and a cured composition of
(b) inorganic particles having insulating and heat-dissipating properties.

2. The wiring board of claim 1, wherein the composition comprises the inorganic particles in the proportion of 60 to 80 parts by mass.

3. The wiring board of claim 1, wherein the inorganic particles comprises at least one selected from the group consisting of silicon oxide, aluminium oxide, zinc oxide, aluminium nitride, and boron nitride particles.

4. The wiring board of claim 1, wherein the cured composition has a Hunter whiteness of 87 or more.

* * * * *